United States Patent
Rafi et al.

(10) Patent No.: US 9,712,176 B1
(45) Date of Patent: Jul. 18, 2017

(54) APPARATUS FOR LOW POWER SIGNAL GENERATOR AND ASSOCIATED METHODS

(71) Applicant: Silicon Laboratories Inc., Austin, TX (US)

(72) Inventors: Aslamali A. Rafi, Austin, TX (US); Mustafa H. Koroglu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/179,847

(22) Filed: Jun. 10, 2016

(51) Int. Cl.
| | |
|---|---|
| H03L 7/06 | (2006.01) |
| H03L 7/183 | (2006.01) |
| H04L 7/033 | (2006.01) |
| H04B 7/02 | (2017.01) |

(52) U.S. Cl.
CPC ............ H03L 7/183 (2013.01); H04B 7/028 (2013.01); H04L 7/033 (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 7,379,723 B2 | 5/2008 | Rafi | |
| 2001/0052823 A1* | 12/2001 | Hirano | H03L 7/087 331/11 |
| 2003/0078016 A1* | 4/2003 | Groe | H04B 1/04 455/91 |
| 2005/0219003 A1* | 10/2005 | Urakawa | H03L 7/099 331/117 R |
| 2012/0046007 A1* | 2/2012 | Rafi | H03D 7/00 455/209 |
| 2012/0319787 A1* | 12/2012 | Trivedi | H03B 5/1228 331/117 FE |
| 2013/0281029 A1* | 10/2013 | Lee | H03D 7/12 455/73 |
| 2016/0164528 A1* | 6/2016 | Morton | H03L 7/093 327/157 |
| 2016/0164558 A1* | 6/2016 | Elzeftawi | H03B 19/12 455/192.1 |

OTHER PUBLICATIONS

U.S. Appl. No. 15/370,742, filed Dec. 2016, Rafi et al.
Gerry C.T. Leung, *A 1-V 5.2-GHz CMOS Synthesizer for WLAN Applications*, IEEE J. of Solid-State Circuits 1873-82 (2004), 10 pgs.
Kyoohyun Lim, *A 2×2 MIMO Tri-Band Dual-Mode Direct-Conversion CMOS Transceiver for Worldwide WiMAX/WLAN Applications*, IEEE J. of Solid-State Circuits 1648-58 (2011), 11 pgs.

* cited by examiner

*Primary Examiner* — Adam Houston
(74) *Attorney, Agent, or Firm* — Law Offices of Maximilian R. Peterson (57) ABSTRACT

An apparatus includes a signal generator. The signal generator includes a voltage controlled oscillator (VCO) coupled to provide an output signal having a frequency. The signal generator further includes an asymmetric divider coupled to receive the output signal of the VCO and to provide an output signal. The output signal of the asymmetric divider has a frequency that is lower than the frequency of the output signal of the VCO. The asymmetric divider presents a balanced load to the VCO.

20 Claims, 11 Drawing Sheets

APPARATUS FOR LOW POWER SIGNAL GENERATOR AND ASSOCIATED METHODS

TECHNICAL FIELD

The disclosure relates generally to signal generators and, more particularly, to apparatus for low power signal generation and clock signal generation, and associated methods.

BACKGROUND

With the increasing proliferation of wireless technology, such as Wi-Fi, Bluetooth, and mobile or wireless Internet of things (IoT) devices, more devices or systems incorporate radio frequency (RF) circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry. A variety of types and circuitry for transmitters and receivers are used. Transmitters send or transmit information via a medium, such as air, using RF signals. Receivers at another point or location receive the RF signals from the medium, and retrieve the information. Typically, transmitters transmit coded data via RF signals. Receivers receive, decode, demodulate, etc. the RF signals to retrieve the data.

In some applications, RF circuitry, such as transmitters, receivers, or transceivers, are built into or included in mobile or wireless apparatus. In such applications, various circuitry, including the RF circuitry, are powered by power sources like batteries. A variety of techniques, such as strategic clocking, lower operating frequencies, smaller circuit geometries, and the like, have been used to reduce the power consumption of the apparatus and, thus, lengthen the life of the power source (or increase the length of time before the power source is recharged).

The description in this section and any corresponding figure(s) are included as background information materials. The materials in this section should not be considered as an admission that such materials constitute prior art to the present patent application.

SUMMARY

A variety of apparatus and associated methods for signal generation are contemplated. According to one exemplary embodiment, an apparatus a signal generator. The signal generator includes a voltage controlled oscillator (VCO) coupled to provide an output signal having a frequency. The signal generator further includes an asymmetric divider coupled to receive the output signal of the VCO and to provide an output signal. The output signal of the asymmetric divider has a frequency that is lower than the frequency of the output signal of the VCO. The asymmetric divider presents a balanced load to the VCO.

According to another exemplary embodiment, an IC includes a frequency synthesizer. The frequency synthesizer includes a VCO coupled to provide an output signal having a frequency that is a function of a control signal. The frequency synthesizer further includes a divider coupled to receive the output signal of the VCO, and to divide the frequency of the output signal of the VCO to generate an output signal with a lower frequency than the frequency of the output signal of the VCO. The frequency synthesizer further includes a shift register coupled to receive and shift the output signal of the first divider to generate balanced quadrature output signals including at least one in-phase signal and at least one quadrature signal.

According to another exemplary embodiment, a method includes generating a signal, using a VCO, having a frequency. The method further includes receiving the signal from the VCO in an asymmetric divider, and providing an output signal of the asymmetric divider. The output signal has a frequency lower than the frequency of the signal generated by the VCO. The asymmetric divider presents a balanced load to the VCO.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to signal generator apparatus for use in, for example, RF receivers, transmitters, or transceivers. More specifically, the disclosed concepts provide apparatus and methods for signal generator apparatus (e.g., local oscillator, or LO) with relatively low power consumption, relatively low or reduced phase noise, relatively high quadrature accuracy, and provision of feedback clock (e.g., for use in phase locked loops (PLLs), with reduced or relatively low power consumption. Examples of signal generator apparatus and associated methods, as well as features and attributes of such apparatus and methods, are described below in detail.

Signal generator apparatus, such as LOs, according to exemplary embodiments may be used in a variety of apparatus, for instance, RF receivers, RF transmitters, and RF transceivers. FIGS. 1-4 provide various RF apparatus in which signal generators according to exemplary embodiments may be used.

Figure 1:
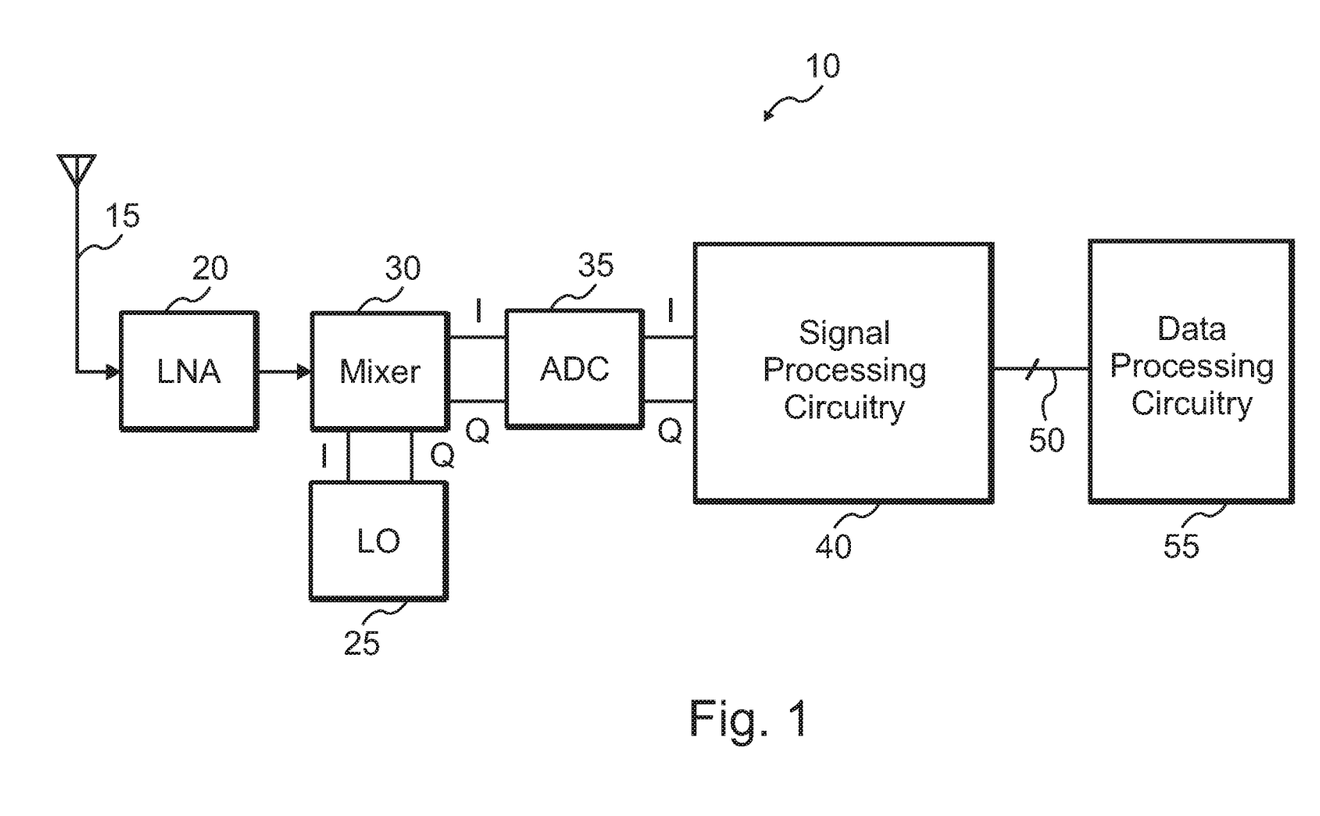
FIG. 1 illustrates a circuit arrangement for an RF receiver that uses a signal generator according to an exemplary embodiment.

FIG. 1 illustrates a circuit arrangement for a receiver 10 according to an exemplary embodiment. Receiver 10 receives RF signals via antenna 15. The RF signals feed an input of low noise amplifier (LNA) 20. LNA 20 provides low-noise amplification of the RF signals, and provides amplified RF signals to mixer 30.

Mixer 30 performs frequency translation or shifting of the RF signals, using a reference or local oscillator (LO) frequency provided by LO 25. For example, in some embodiments, mixer 30 translates the RF signal frequencies to baseband frequencies. As another example, in some embodiments, mixer 30 translates the RF signal frequencies to an intermediate frequency (IF). LO 25 (a signal generator), described in detail below, provides two reference signals, with a quadrature relationship, to mixer 30. More specifically, LO 25 provides an in-phase (I) signal 25I and a quadrature (Q) signal 25Q to mixer 30. Signals 25I and 25Q have a quadrature relationship, i.e., they are out of phase with respect to each other by 90° or $$\frac{\pi}{2}$$

radians, as persons of ordinary skill in the art will understand.

Mixer 30 provides the translated output signal as a set of two signals, I and Q. The I and Q signals are analog time-domain signals. Analog to digital converter (ADC) 35 converts the I and Q signals to digital I and Q signals. In exemplary embodiments, ADC 35 may use a variety of signal conversion techniques. For example, in some embodiments, ADC 35 may use delta-sigma (or sometimes called sigma-delta) analog to digital conversion. ADC 35 provides the digital I and Q signals to signal processing circuitry 40. Generally speaking, signal processing circuitry 40 performs processing on the digital I and Q signals, for example, digital signal processing (DSP). Signal processing circuitry 40 can perform a variety of signal processing functions, such as demodulation, to retrieve or extract information, such as data signals, that were modulated (e.g., in a transmitter (not shown)), and provided to antenna 15 as RF signals.

Signal processing circuitry 40 provides information, such as the demodulated data, to data processing circuitry 55 via link 50. Data processing circuitry 55 may perform a variety of functions (e.g., logic, arithmetic, etc.). For example, data processing circuitry 55 may use the demodulated data in a program, routine, or algorithm (whether in software, firmware, hardware, or a combination) to perform desired control or data processing tasks. In some embodiments, data processing circuitry 55 may perform control of other circuitry, sub-system, or systems (not shown). In some embodiments, data processing circuitry 55 may provide the data (after processing, as desired, for example, filtering) to another circuit (not shown), such as a transducer, display, etc.

In exemplary embodiments, link 50 may take a variety of forms. For example, in some embodiments, link 50 may constitute a number of conductors or coupling mechanisms, such as wires, cables, printed circuit board (PCB) traces, etc. Through link 50, signal processing circuitry 40 and data processing circuitry 55 may exchange information, such as the demodulated data, control information or signals, status signals, etc., as desired.

Figure 2:
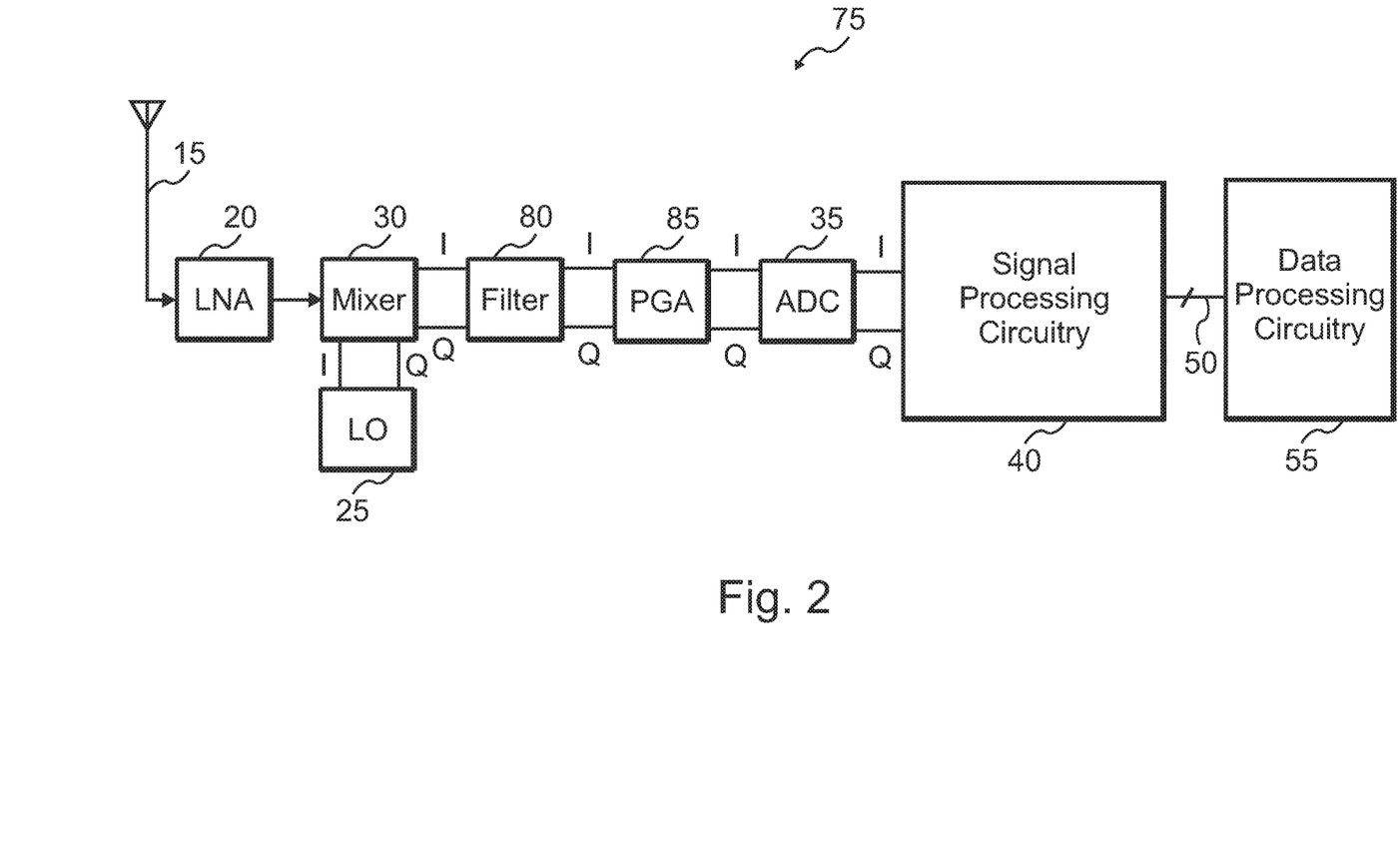
FIG. 2 depicts a circuit arrangement for another RF receiver that uses a signal generator according to an exemplary embodiment.

FIG. 2 depicts a circuit arrangement for a receiver 75 according to an exemplary embodiment. Receiver 75 generally has a similar architecture as does receiver 10 (see FIG. 1). Referring again to FIG. 2, receiver 75 includes a filter 80 and a programmable gain amplifier (PGA) 85. Filter 80 provides filtering of the RF or baseband signal at the output of mixer 30. PGA 85 provides programmable gain for the filtered signal at the output of filter 80.

In some embodiments, PGA 85 has a gain that is programmable for different input levels of the RF signals received by antenna 15. In some embodiments, PGA 85 has a gain that is programmable for different frequency bands of the RF signals received by antenna 15. In some embodiments, PGA 85 may include more than one stage of amplification, for example, two or more "slices" of amplifier circuitry coupled in a cascade configuration, as desired. The gain of the various stages may be programmed in a similar or independent manner, as desired.

Note that variations of receiver 75 are possible and contemplated in exemplary embodiments. For example, in some embodiments, receiver 75 may include filter 80, but not PGA 85. Conversely, as another example, in some embodiments, receiver 75 may include PGA 85, but not filter 80. Other possibilities exist, for example, including one or more filters between antenna 15 and LNA 20 to facilitate accommodating several RF signal bands, etc. As another example, in some embodiments, the order of filter 80 and PGA 85 may be reversed. LO 25, described below in detail, may be used in any of the configuration described above.

Figure 3:
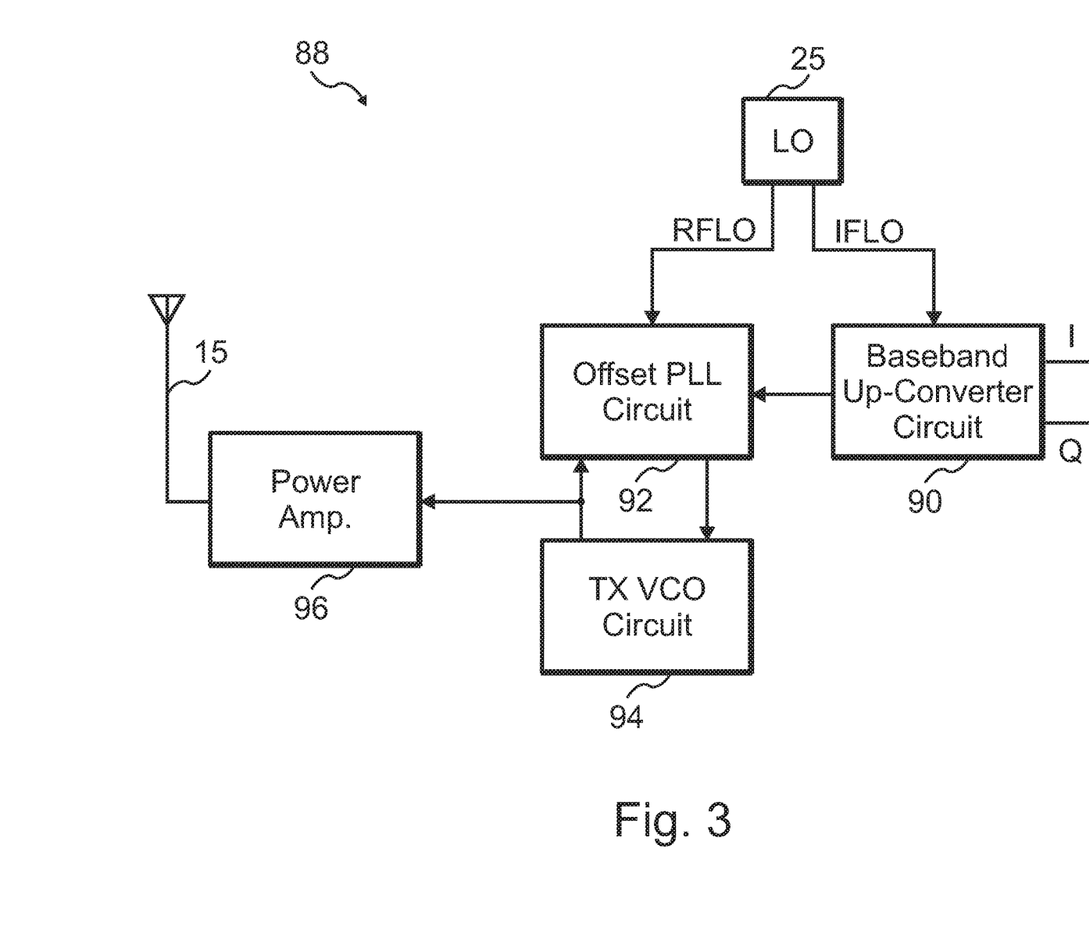
FIG. 3 shows a circuit arrangement for an RF transmitter that uses a signal generator according to an exemplary embodiment.

In addition to receivers, signal generators such as LOs according to exemplary embodiments may be used in other RF circuitry, such as RF transmitters or RF transceivers. FIG. 3 shows a circuit arrangement for an RF transmitter 88 that uses a signal generator according to an exemplary embodiment. More specifically, transmitter 88 uses LO 25 (described below in detail).

Transmitter 88 includes baseband up-converter circuit 90. Baseband up-converter circuit 90 receives an intermediate frequency (IF) LO signal (IFLO) from LO 25. Baseband up-converter circuit 90 mixes the IFLO signal transmit I and Q signals (input signals to baseband up-converter circuit 90), and provides an up-converted IF signal to offset PLL circuitry 92. Offset PLL circuitry 92 effectively filters the up-converted IF signal (i.e., offset PLL circuit 92 allows to pass signals within its bandwidth, but attenuates other signals), thus attenuating spurious or noise signals outside its bandwidth. As a result, less filtering may be used before transmitting the RF signal via antenna 15.

Offset PLL circuitry 92 forms a feedback loop with transmit voltage controlled oscillator (VCO) circuit (or TX VCO circuit) 94 via an offset PLL output signal and a transmit VCO signal that is provided by TX VCO circuit 94. Offset PLL circuitry 92 uses a mixer (not shown) to mix an RF local oscillator (RFLO) signal from LO 25 with the transmit VCO signal. Power amplifier (PA) 96 receives the transmit VCO signal, and provides an amplified signal to antenna 15 for transmission.

Note that in the embodiment shown in FIG. 3, transmitter 88 uses two signals (IFLO and RFLO) in its operation. To accommodate those signals, LO 25 may include circuitry that generates both the IFLO and RFLO signals, or circuitry within LO 25 may be duplicated to generate the IFLO and RFLO signals, respectively. Furthermore, in the embodiment shown, transmitter 88 in FIG. 3 uses an IF signal (IFLO), but other transmitter configurations are contemplated and may similarly use LO 25. For example, in some embodiments, transmitter 88 may use a single LO signal, such as RFLO, to directly up-convert input signals to an RF signal for transmission by antenna 15.

Figure 4:
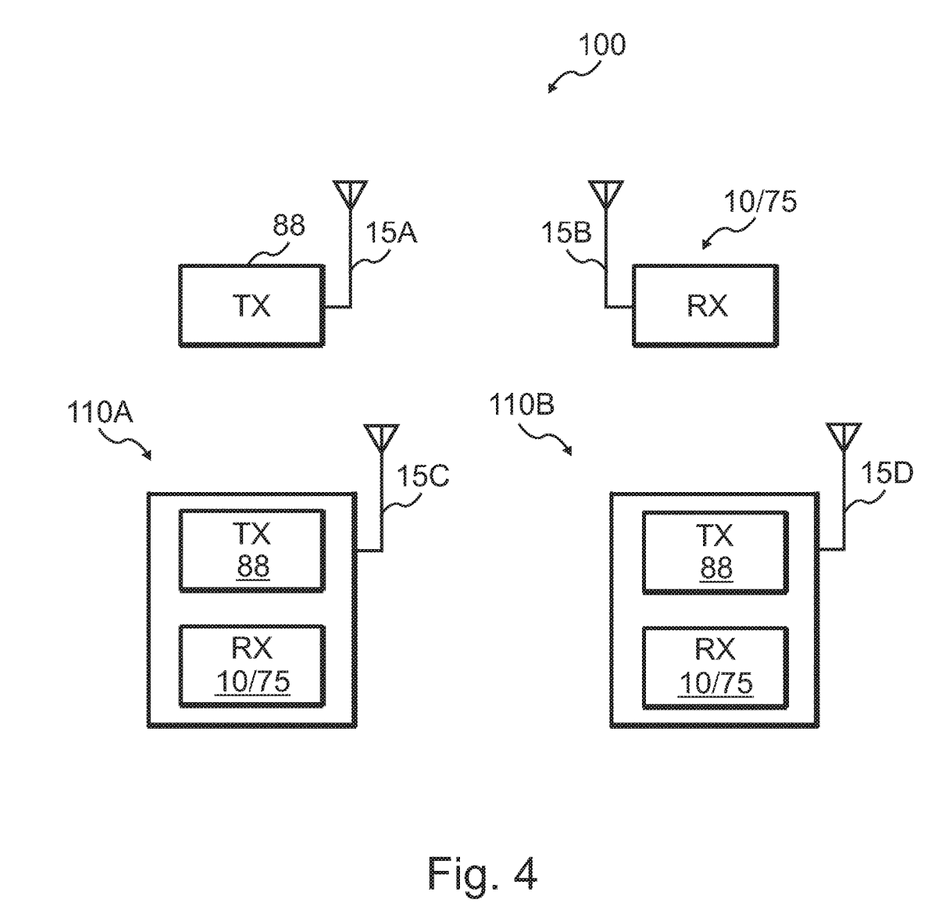
FIG. 4 illustrates a circuit arrangement for a system for radio communication that uses signal generators according to an exemplary embodiment.

In some embodiments, one or more RF receivers (e.g., as shown in FIGS. 1-2) and one or more RF transmitters (e.g., as shown in FIG. 3) may be combined to form an RF transceiver. In such embodiments, the RF transceiver has the capability to both receive and transmit RF signals, as persons of ordinary skill in the art will understand. Receivers, transmitters, and/or transceivers according to exemplary embodiments may be used in a variety of communication arrangements, systems, sub-systems, networks, etc., as desired. FIG. 4 shows a system 100 for radio communication according to an exemplary embodiment.

System 100 includes a transmitter 88, coupled to antenna 15A. Via antenna 15A, transmitter 88 transmits RF signals. The RF signals may be received by receiver 10, described above (alternatively, the receiver may constitute receiver 75, also described above). In addition, or alternatively, transceiver 110A and/or transceiver 110B might receive (via receiver 10 or 75) the transmitted RF signals.

In addition to receive capability, transceiver 110A and transceiver 110B can also transmit RF signals. The transmitted RF signals might be received by receiver 10 or 75, either in the stand-alone receiver, or via the receiver circuitry of the non-transmitting transceiver. Other systems or sub-systems with varying configuration and/or capabilities are also contemplated. For example, in some exemplary embodiments, two or more transceivers (e.g., transceiver 110A and transceiver 110B) might form a network, such as an ad-hoc network. As another example, in some exemplary embodiments, transceiver 110A and transceiver 110B might form part of a network, for example, in conjunction with transmitter 88.

Figure 5:
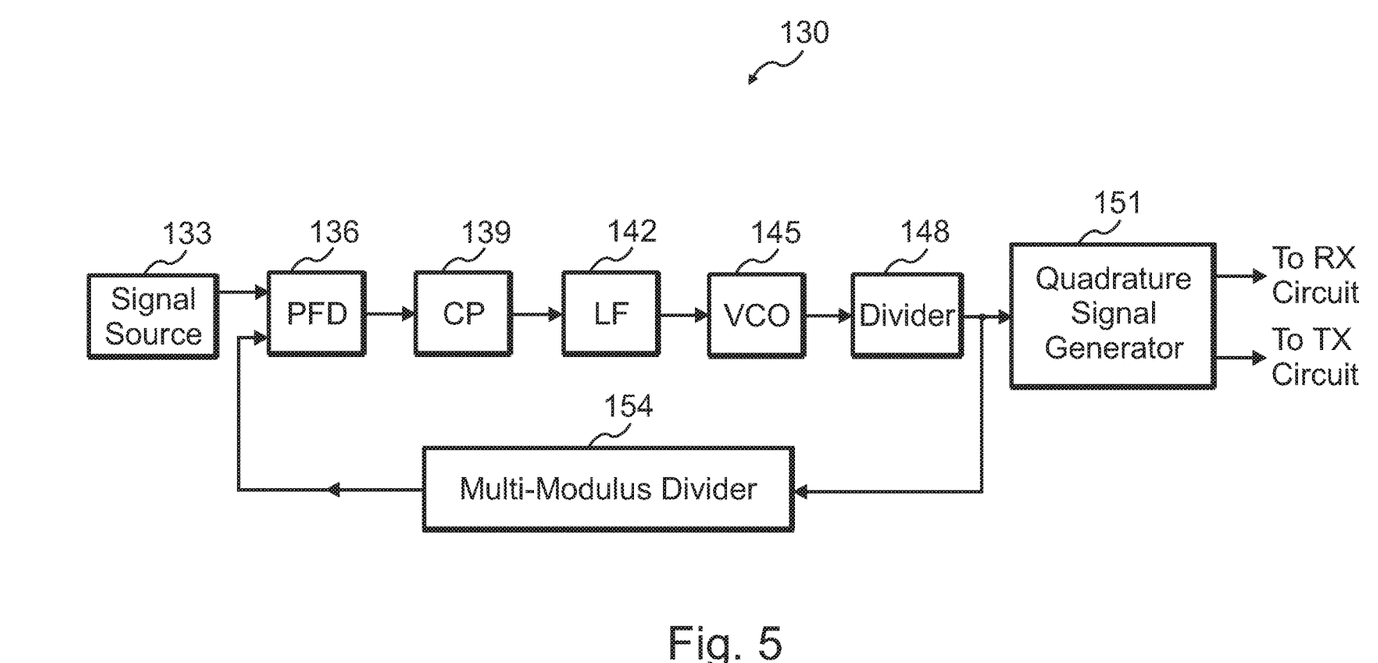
FIG. 5 depicts a circuit arrangement for a signal generator, such as a local oscillator (LO) according to an exemplary embodiment.

FIG. 5 depicts a circuit arrangement 130 for a signal generator, such as LO 25 discussed above, according to an exemplary embodiment. Circuit arrangement 130 uses a phase locked loop (PLL) circuit to form a frequency synthesizer. The frequency synthesizer can provide one or more LO signals (e.g., an LO signal for use in an RF receiver, an LO signal for use in an RF transmitter, or both, as shown at the output of quadrature signal generator 157, etc.), as desired. If a generation of a single LO signal is desired, circuitry corresponding to generation of a second LO signal (e.g., buffers) may be omitted.

Referring again to FIG. 5, circuit arrangement 130 includes a signal source 133 that generates an input signal to phase/frequency detector (PFD) 136. A variety of devices, circuits, or blocks may be used to implement signal source 133. Examples include crystal (XTAL) oscillator, resistor capacitor (RC) oscillator, inductor capacitor (LC) oscillator, and the like, as persons of ordinary skill in the art will understand. Generally, signal source 133 includes an oscillator that provides an oscillator signal or oscillator output signal to PFD 136.

PFD 136 receives a second input signal from multi-modulus divider 154. As FIG. 5 shows, multi-modulus divider 154 is coupled in a negative feedback loop that also includes PFD 136, charge pump (CP) 139, loop filter (LF) 142, VCO 145, and divider 148. As described below, multi-modulus divider 154 provides a feedback signal (sometimes known as a clock feedback signal) to PFD 136. PFD 136 provides an output signal that represents or is related to the difference in phase or frequency of its two input signals.

Charge pump 139 receives the output signal of PFD 136. In response, CP 139 provides an output signal to loop filter 142. Loop filter 142 filters (typically, low-pass filtering) the signal received from charge pump 139, and provides the resulting filtered signal to VCO 145. In other words, the output signal of loop filter 142 serves as the voltage control signal for VCO 145.

In response to the voltage control signal from loop filter 142, VCO 145 generates an output signal with a certain frequency. The output signal of VCO 145 drives divider 148. The frequency of the output signal of VCO 145 depends on the voltage level of the control signal from loop filter 142. Thus, variations in the control signal from loop filter 142 cause corresponding changes in the frequency of the output signal of VCO 145. Given that the control signal from loop filter 142 represents or is derived from the difference in phase or frequency in the two input signals of PFD 136, loop filter 142 drives VCO 145 (coupled in the feedback loop with multi-modulus divider 154, as noted above) so as to reduce the difference in phase or frequency in the two input signals of PFD 136.

Divider 148 divides the frequency of the output signal of VCO 145 by a desired number. For example, in some embodiments, divider 148 may divide the frequency of the output signal of VCO 145 by four. In other embodiments, different divisors may be used, as desired, depending on factors such as design and performance specifications, as persons of ordinary skill in the art will understand.

The output signal of divider 148 drives the inputs of multi-modulus divider 154 and quadrature signal generator 151. Quadrature signal generator 151 generates one or more signals as its output signals. In the embodiment shown, quadrature signal generator 151 provides two output signals, one that drives receiver circuits, and one that drives transmit circuits, although other numbers of output signals may be generated and used, for instance, a single output signal. Each output signal of quadrature signal generator 151 includes two signals, i.e., an in-phase (I) and a quadrature (Q) signal. Through operation of quadrature signal generator 151, the in-phase and quadrature signals ideally have a quadrature relationship. Because of circuit imperfections, the in-phase and quadrature signals ideally have a nearly quadrature or substantially quadrature relationship (e.g., less one degree phase deviation from perfect quadrature, etc.).

As noted above, the output signal of divider 148 drives the input of multi-modulus divider 154. In exemplary embodiments, multi-modulus divider 154 may be implemented in a variety of ways, depending on factors such as design and performance specifications, available technology for a given implementation, cost, complexity, frequency plans for frequency synthesizer/LO 25 and/or the RF receiver/transmitter, etc., as persons of ordinary skill in the art will understand. Furthermore, a variety of types of multi-modulus divider 154 may be used, for example, dividers appropriate for use in a fractional-N frequency synthesizer/LO 25. In other applications, different types or architectures of multi-modulus divider 154 may be used, as persons of ordinary skill in the art will understand. Regardless of the details of implementation, multi-modulus divider 154 divides the frequency of the output signal of divider 148 by a desired factor to generate an output signal that drives an input of PFD 136, as described above. The division operation lowers the frequency of the input signal to PFD 136 to a level comparable to the frequency of the output signal of signal source 133.

For example, suppose that signal source 133 generates a nominal 10 MHz output signal, and one desires to generate quadrature signals at the output(s) of quadrature signal generator 151 with a frequency of 100 MHz. In this example, VCO 145 might generate an output signal with a frequency of 400 MHz. Through the divide-by-four operation of divider 148, the input signal to multi-modulus divider 154 would have a frequency of 100 MHz. Multi-modulus divider 154 would divide the frequency of its input signal by a factor of 10, thus providing a 10 MHz feedback signal to PFD 136. As persons of ordinary skill in the art understand, the example above constitutes one possible set of values, and other values, such as the divisor or division factor of divider 148 and/or multi-modulus divider 154 may be used, as desired, depending on factors such as design and performance specifications, available technology, cost, etc. By virtue of using divider 148, the frequency of the input signal to multi-modulus divider 154 is reduced (by a factor of four, in this example), which helps to reduce the power consumption of multi-modulus divider 154 and, thus, of LO 25 overall.

Figure 6:
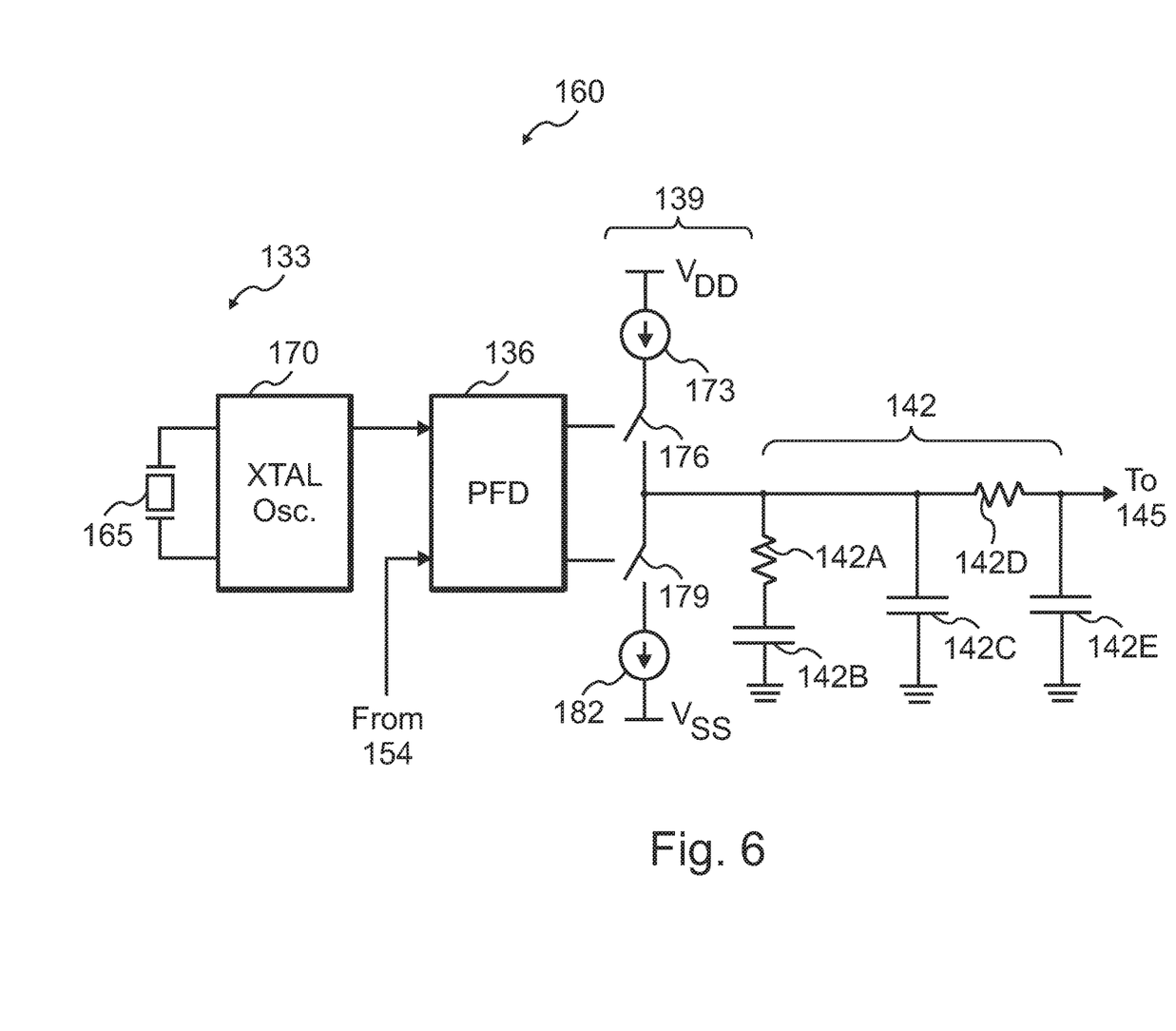
FIG. 6 shows a circuit arrangement for a signal source, phase/frequency detector, charge pump, and loop filter according to an exemplary embodiment.

FIGS. 6-10 provide further details of the various blocks, such as the blocks in circuit arrangement 130 in FIG. 5. FIG. 6 shows a circuit arrangement 160 for signal source 133, PFD 136, charge pump 139, and loop filter 142 according to an exemplary embodiment. More specifically, in the embodiment shown, signal source 133 constitutes a crystal-based source, which includes crystal 165 coupled to a crystal oscillator 170. As persons of ordinary skill in the art will understand, crystal oscillator 170 provides an output signal to PFD 136 whose frequency depends on the frequency of oscillation or vibration of crystal 165. As noted, in addition to the output signal of signal source 133, PFD 136 receives the output signal of multi-modulus divider 154, and generates output signals that drive charge pump 139. PFD 136 may be implemented using a variety of circuitry (e.g., using flip flops). The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring again to FIG. 6, in the embodiment shown, charge pump 139 includes switches 176 and 179, driven by the output signals of PFD 136, respectively. Through switches 176 and 179, currents sourced/sunk by current sources 173 and 182 are provided to or withdrawn from loop filter 142. Loop filter 142 in the example shown includes resistors 142A and 142D, and capacitors 142B, 142C, and 142E. The values and configuration or arrangement of the components in loop filter 142 depends on the type and characteristics of the desired transfer function (e.g., low pass, band pass, etc.) of filter 142, as persons of ordinary skill in the art will understand.

Figure 7:
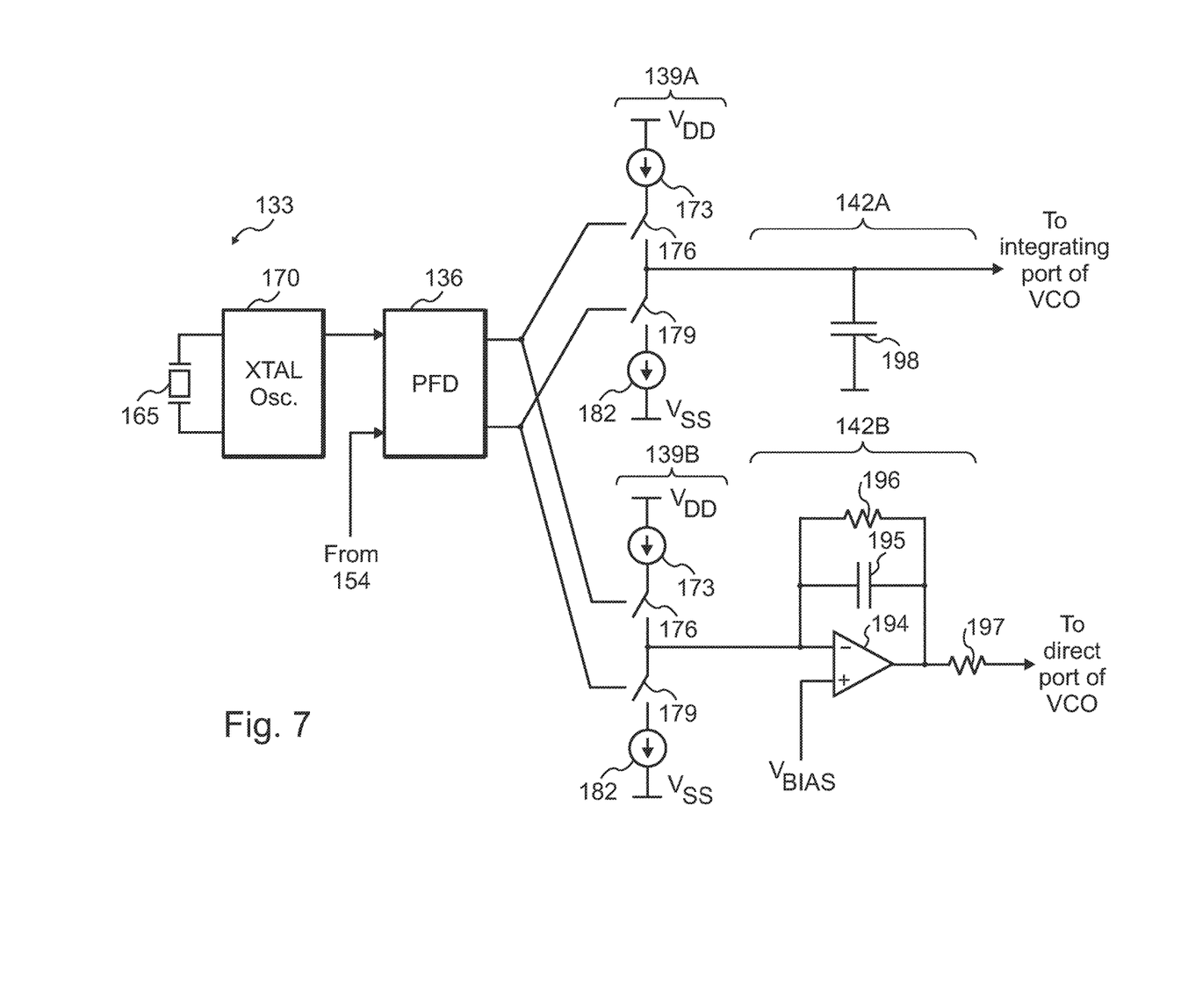
FIG. 7 illustrates a circuit arrangement for a signal source, phase/frequency detector, charge pumps, and loop filters according to an exemplary embodiment.

Note that the embodiment in FIG. 6 represents merely one way of implementing signal source 133, PFD 136, charge pump 139, and loop filter 142, and other implementations are contemplated and possible. As merely one example, FIG. 7 illustrates an exemplary embodiment with dual path loop filters 142A, 142B. More specifically, in the embodiment in FIG. 7, two charge pumps 139A, 139B receive the respective outputs of PFD 136. Charge pump 139A, corresponding to the integrating path of the VCO, feeds loop filter 142A, which includes capacitor 198. Conversely, charge pump 139B, corresponding to the direct path (the other path) of the VCO, feeds loop filter 142B. Loop filter 142B is a low pass RC-RC filter, where "RC" denotes resistor-capacitor. Loop filter 142B includes transconductance current amplifier (TIA) 194, with a feedback circuitry that includes capacitor 195 and resistor 196. The output of TIA 194 drives the direct path of the VCO via resistor 197.

Figure 8:
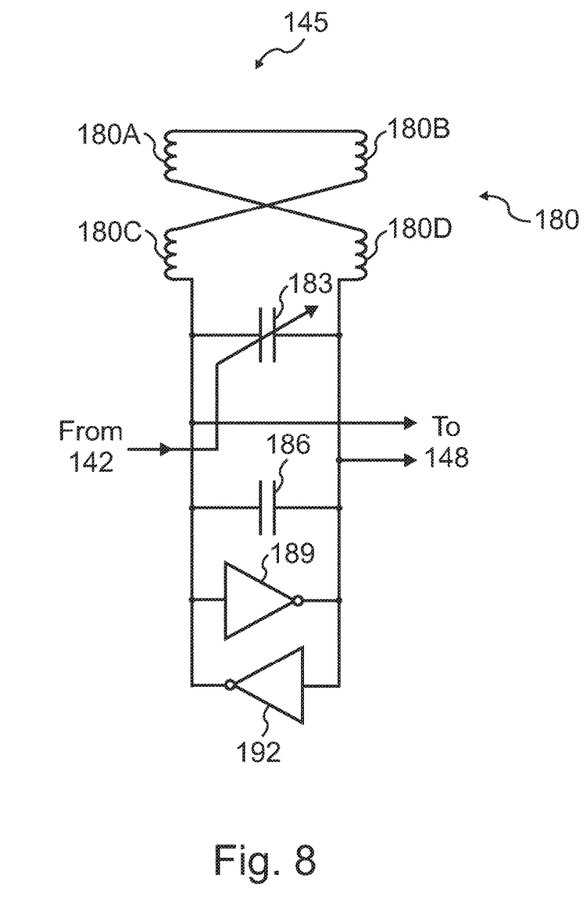
FIG. 8 depicts a circuit arrangement for voltage controlled oscillator (VCO) according to an exemplary embodiment.

FIG. 8 illustrates a circuit arrangement for VCO 145 according to an exemplary embodiment. In the embodiment shown, VCO 145 includes an inductor 180 coupled in a resonant tank with capacitor 186 and variable capacitor 183. Inductor 180 in the example shown includes inductor elements (segments) 180A-180D, although other numbers and/or arrangements of inductor elements or segments might be used, as desired. In some embodiments, inductor 180 (including any elements or segments) might be implemented using bond wires. In other embodiments, inductor 180 (including any elements or segments) might be implemented using traces within an IC, for example, traces within a metal layer. The parallel combination of capacitor 186 and variable capacitor 183 (plus any other capacitance that effectively appears in parallel with capacitor 186 and variable capacitor 183) is coupled in parallel with inductor 180 to form a resonant tank. The output signal of loop filter 142 (not shown in FIG. 8) controls the capacitance of variable capacitor 183 and, thus, the frequency of oscillation of the LC resonant tank. Variable capacitor 183 may be implemented using a variety of techniques and circuitry, as persons of ordinary skill in the art will understand. Back to back coupled inverters 189 and 192 provide a negative transconductance or resistance to sustain resonance in the tank (i.e., compensate for circuit losses because of parasitic elements (e.g., conductor resistance) in the tank or, generally, in VCO 145. The output signal of VCO 145, coupled across the resonant tank, drives divider 148.

Figure 9:
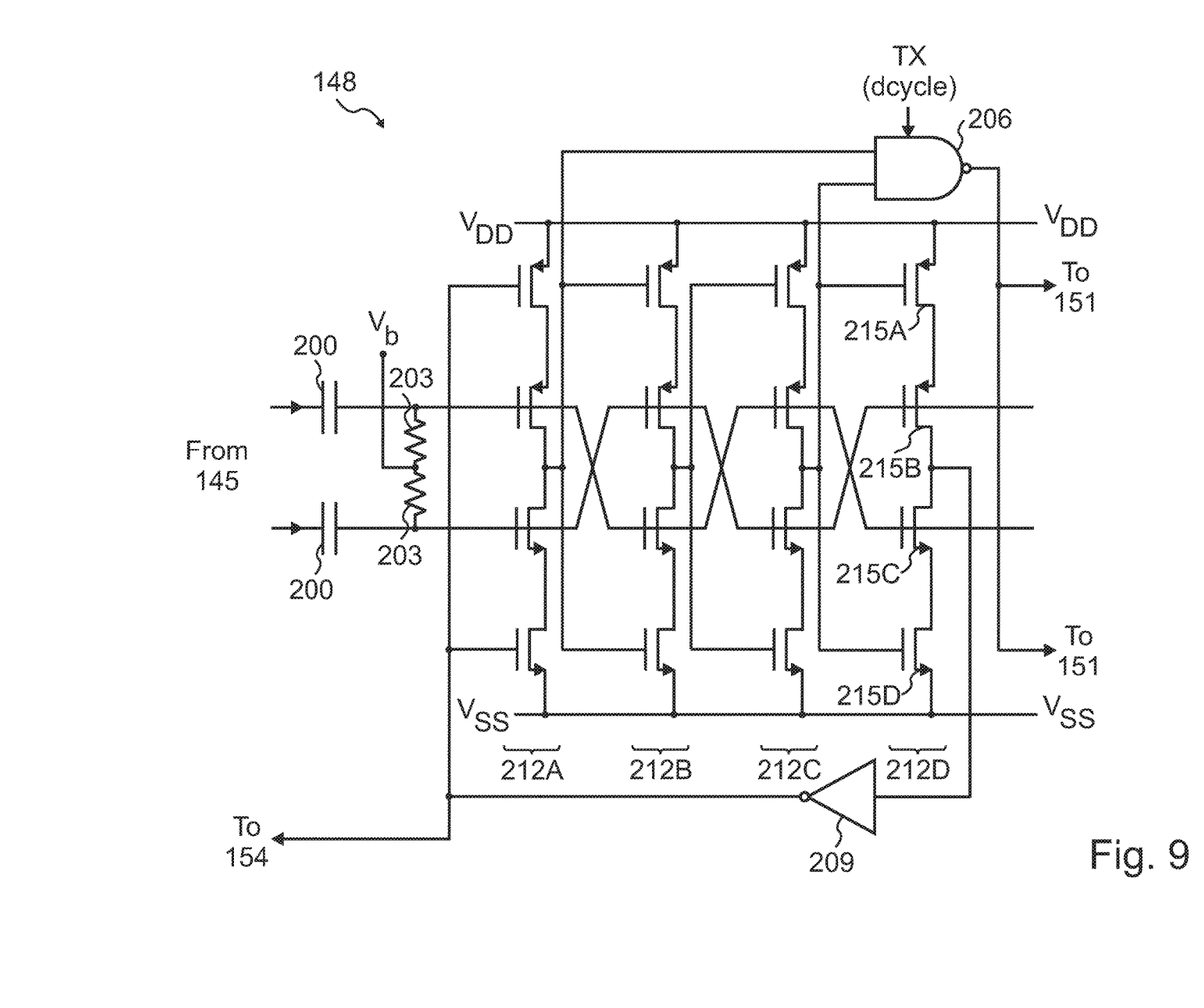
FIG. 9 shows a circuit arrangement for a divider according to an exemplary embodiment.

FIG. 9 depicts a circuit arrangement for divider 148 according to an exemplary embodiment. The output signals of VCO 145 are AC-coupled to the input of divider 148 via DC block capacitors 200. Resistors 203, coupled to a bias voltage Vb, provide DC bias for the circuitry in divider 148, such as certain transistors in transistor stacks 212A-212D. In the embodiment shown, divider 148 includes four stacks of transistors, labeled 212-A-212D, to form two master slave flip flops. In other words, transistor stack 212A and transistor 212B form one flip flop, whereas transistor stack 212C and transistor 212D form another flip flop, driven by the first flip flop (i.e., including transistor stack 212A and transistor 212B).

The output signal of transistor stack 212D is inverted by inverter 209, and the inverted signal is provided to the gates of two transistors in transistor stack 212A and also to the input of multi-modulus divider 154 (not shown). Note that the output signal of VCO 145, as coupled through capacitors 200, serve as the clock signal for the flip flops in divider 148, driving the gates of the two middle transistors in each of transistor stacks 212A-212D. Given that the output of divider 148 is retimed by the output signal of VCO 145, and given that that the output signal of VCO 145 has a relatively low phase noise, the division process has relatively low or minimal impact on the overall phase noise of the output signal of the frequency synthesizer/LO 25.

Divider 148 further includes logic circuit 206. Logic circuit 206 changes the pulse width or duty cycle of the output signal of divider 148. As a result, LO 25 can generate in-phase and quadrature signals of different duty cycles (e.g., for RF reception and RF transmission, respectively). The inputs of logic circuit 206 are driven by the outputs of transistor stack 212A and transistor stack 212C, respectively. Depending on a signal level (logic value) of a control or mode signal (labeled dcycle), the duty cycle of the output signal of logic circuit 206 changes. For example, with one logic value of the dcycle signal, the output signal of logic circuit 206 might have a 25% duty cycle (for example, in RF reception mode), and with another (e.g., opposite) logic value of the dcycle signal, the output signal of logic circuit 206 might have a 50% duty cycle (for example, in RF transmission mode). Generally, logic circuit 206 may be implemented using a variety of circuitry. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

In the embodiment shown, logic circuit 206 is a NAND gate with modified functionality ("modified NAND gate" to facilitate discussion). Modified NAND gate 206 receives the dcycle signal, which causes change of the duty of cycle of the output signal of divider 148, as noted above. In one mode, for example, RF reception, as signified by a signal level (e.g., logic low value) of the dcycle signal, modified NAND gate 206 performs an AND (rather than NAND) operation on its input signals. Conversely, in another mode of operation, for example, RF transmission, as signified by another signal level (e.g., logic high value) of the dcycle signal, modified NAND gate 206 performs an ordinary NAND operation on its input signals. As a result, the duty cycle of the output signal of modified NAND gate 206 changes depending on the signal level of the control or mode signal, dcycle. Note that if dual mode operation of LO 25 is not desired, logic circuit 206 (modified NAND gate 206) may be omitted.

The master slave flip flops in divider 148 consume relatively small amounts of power, which causes divider 148 to have improved or lowered power consumption characteristics. More specifically, the flip flops in divider 148, each using 8 transistors (i.e., transistor stacks 212A-212B for one flip flop, and transistor stacks 212C-212D for another flip flop) are single ended, and are arranged in an intrinsically asymmetric topology, i.e., divider 148 has an asymmetric topology or configuration. In conventional approaches, the divider circuit is also used to generate quadrature signals or, in other words, the quadrature output signals are present in the internal signals of the divider circuit. Since all the quadrature output signals are typically specified to have same or substantially same rise/fall times, the conventional divider circuits use intrinsic symmetry with respect to transistor arrangements. Because the divider is fully symmetric, tapping off from a point within the divider to provide a feedback signal perturbs the symmetry and, therefore, degrades the quadrature accuracy of the output signals. One possible alternative to degrading the symmetry of the output signals is to buffer all four quadrature output signals, and use one buffer's output for the feedback signal, but the addition of buffers causes increased power consumption.

In frequency synthesizers or LOs according to the disclosure, the internal signals in divider 148 are not be used as quadrature signals because of the asymmetry present in the circuit. (Inverter 209 in FIG. 9 aids lowering power consumption at the expense of symmetry.) Divider 148 instead provides single-ended signals to multi-modulus divider 154 and to the shift register in quadrature signal generator 151, which generates subsequently balanced quadrature signals, as described below in detail. Because, as described below, the shift register's input capacitance is resonated out by the resonant tank in VCO 145, this approach reduces the power consumption of frequency synthesizer/LO 25. Thus, the lack of a balanced (asymmetric) architecture of divider 148 helps to improve or lower its power consumption. Divider 148 presents a balanced load to VCO 145 (not shown). The input capacitance (e.g., from the parasitic capacitances of the transistors) of divider 148 appears in parallel with the LC tank in VCO 145, and is thus "resonated out" (i.e., the input capacitance of divider 148, added to the capacitance of capacitor 183 and the capacitance of variable capacitor 186, becomes the effective capacitance value for the LC resonant tank). This technique (resonating out the input capacitance of divider 148) further reduces the overall power consumption of the frequency synthesizer/LO 25. Furthermore, in each flip flop in divider 148, the transistors used in the master section of the flip flop may be sized differently than the transistors in the slave section of the flip in order to further reduce or improve the power consumption of divider 148 and, thus, of the frequency synthesizer/LO 25.

Figure 10:
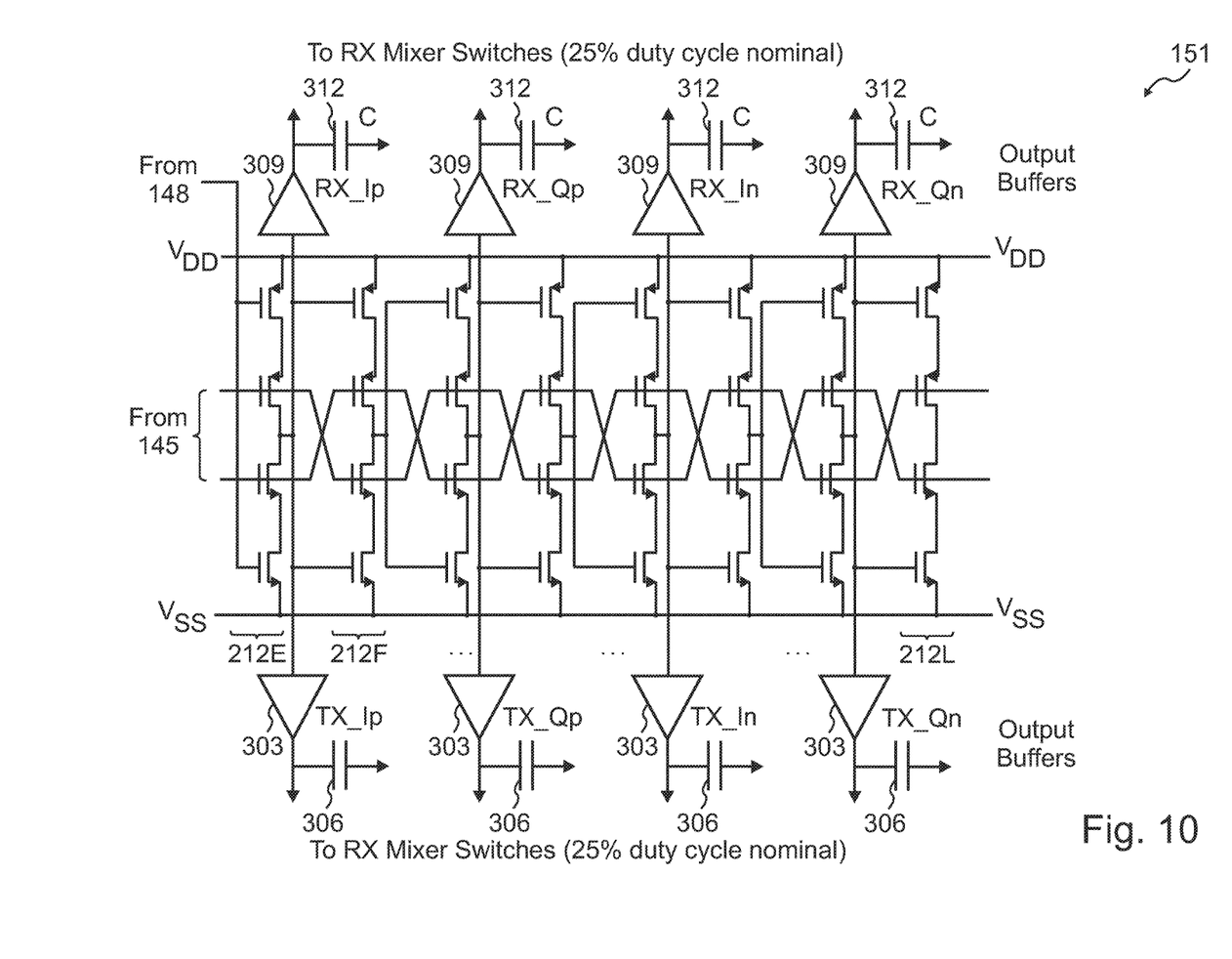
FIG. 10 illustrates a circuit arrangement for quadrature signal generation according to an exemplary embodiment.

FIG. 10 shows a circuit arrangement for quadrature signal generator 151 according to an exemplary embodiment. In the embodiment shown, quadrature signal generator 151 includes a shift register, formed by four cascaded flip flops. Each flip flop includes two stack of four transistors, coupled in cascade. Thus, the shift register includes 8 transistor stacks, labeled 212A-212L in FIG. 10. The first flip flop includes transistor stacks 212A-212B, the second flip flop includes the following two transistor stacks, and so on. The output signal of divider 148 (not shown) drives the gates of the top and bottom transistors in transistor stack 212A in the first flip flop. Note that, similar to the transistor stacks in divider 148, the output of VCO 145 drives the gates of the middle two transistors in transistor stacks 212A-212L. In other words, similar to divider 148, the output signal of VCO 145 serves as the clock signal of the flip flops in the shift register in quadrature signal generator 151. In effect, the shift register includes four D-type flip flops coupled in cascade and clocked by the output signal of VCO 145. The shift register provides at its output signals shifted versions of the output signal of divider 148.

Similar to divider 148, the input capacitance (e.g., from the parasitic capacitances of the transistors) of quadrature signal generator 151 appears in parallel with the LC tank in VCO 145, and is thus "resonated out" (i.e., the input capacitance of quadrature signal generator 151 is added to the capacitance of capacitor 183 and the capacitance of variable capacitor 186). This technique (resonating out the input capacitance of quadrature signal generator 151) further reduces the overall power consumption of the frequency synthesizer/LO 25. Furthermore, in each flip flop in quadrature signal generator 151, the transistors used in the master section of the flip flop may be sized differently than the transistors in the slave section of the flip in order to further reduce or improve the power consumption of quadrature signal generator 151 and, thus, of the frequency synthesizer/ LO 25. Note that the shift register in quadrature signal generator 151 is balanced (ideally completely balanced, but for circuit imperfections in a practical implementation), thus preserving the quadrature accuracy of the output signal(s) of quadrature signal generator 151.

The shift register output signals drive the inputs of buffers 306 and 309. Thus, the output of the first transistor stack (212A) drives one buffer 303 and one buffer 309, the output of the third transistor stack drives a second buffer 303 and a second buffer 309, and so on. The output of the seventh transistor stack drives the fourth buffer 303 and the fourth buffer 309. Buffers 303 provide at their outputs a differential in-phase signal (i.e., a signal TX_I, represented by signals TX_Ip and TX_In) and a differential quadrature signal (i.e., a signal TX_Q, represented by signals TX_Qp and TX_Qn) for use in an RF transmitter circuit, for instance, by mixer switches in transmitter 88. Similarly, buffers 309 provide at their outputs a differential in-phase signal (i.e., a signal RX_I, represented by RX_Ip and RX_In) and a differential quadrature signal (i.e., a signal RX_Q, represented by signals RX_Qp and RX_Qn) for use in an RF receiver circuit, for instance, by switches in mixer 30. Capacitors 306 and 312 represent, respectively, the capacitive loads (e.g., from mixer switches) on the outputs of buffers 303 and 309. In a general circuit arrangement, capacitors 306 and 312 depend on the load applied to the outputs of buffers 303 and 309, and are not necessarily part of the circuitry of quadrature signal generator 151.

Note that the flip flops shown in FIGS. 8 and 9 constitutes merely one way of implementing flip flops in divider 148 and quadrature signal generator 151. Other circuitry for implementing flip flops is contemplated, and may be used in exemplary embodiments. The choice of flip flop circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Figure 11:
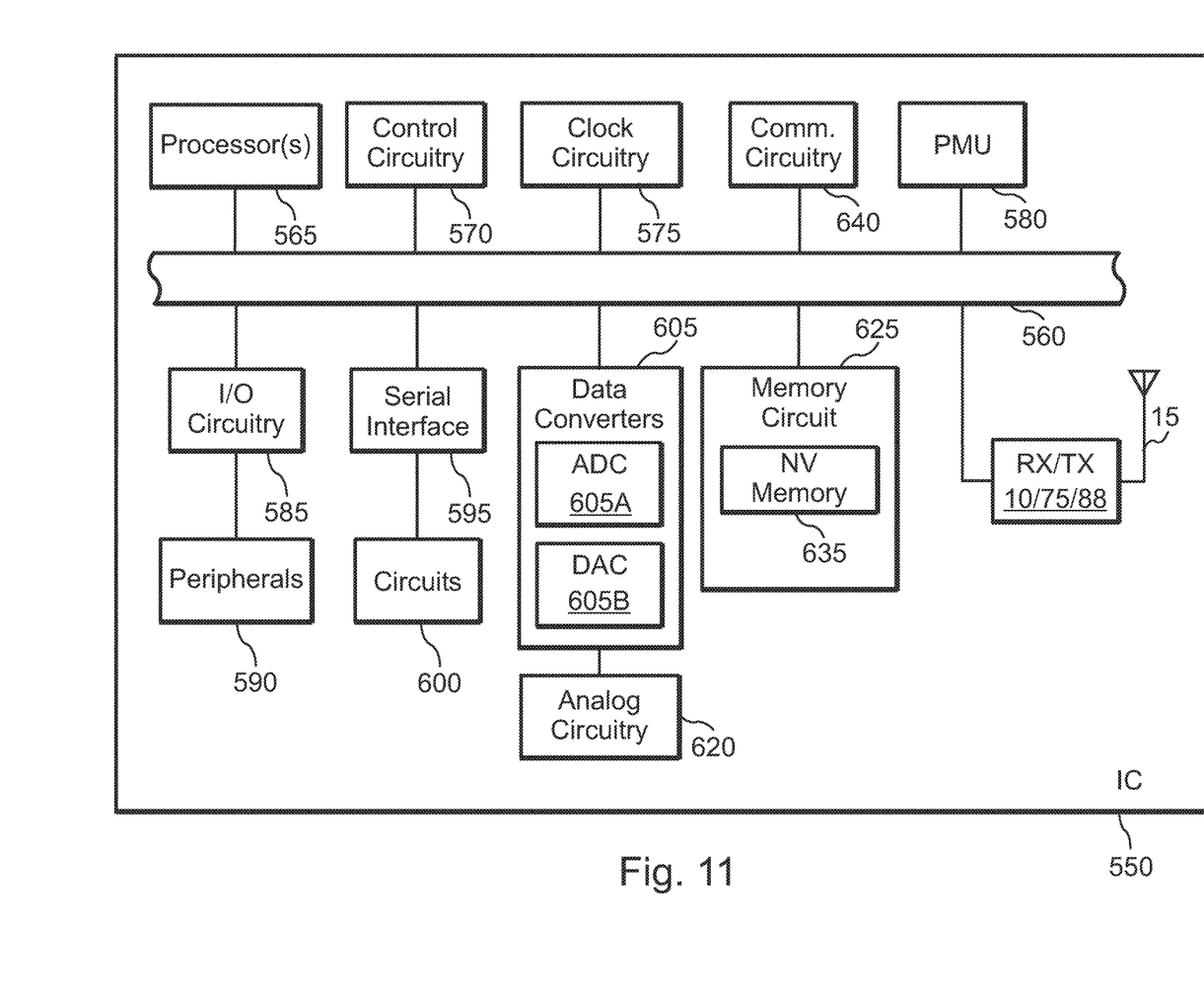
FIG. 11 illustrates a block diagram of an IC according to an exemplary embodiment.

Signal generators, such as frequency synthesizers or LO 25, as used, for example, in RF receivers, RF transmitters, and/or RF transceivers, according to exemplary embodiments, may be combined with other circuitry, for example, circuitry within an IC. FIG. 11 illustrates an IC 550 that combines signal generator(s), such as frequency synthesizers or LO 25 (as used in an RF receiver 10/75 and/or RF transmitter 88) with other circuit blocks according to an exemplary embodiment.

In the embodiment shown, IC 550 constitutes or includes a microcontroller unit (MCU). IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand. Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like. In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 605 may include one or more ADCs 605B and/or one or more DACs 605A. The ADC(s) 605B receive analog signal(s) from analog circuitry 620, and convert the analog signal(s) to a digital format, which they communicate to one or more blocks coupled to link 560. Conversely, DACs 605A receive digital signal(s) from one or more blocks coupled to link 560, convert the digital signal(s) to an analog format, which they communicate to analog circuitry 620. Analog circuitry 620 may include a wide variety of circuitry that provides and/or receives analog signals. Examples include sensors, transducers, and the like, as persons of ordinary skill in the art will understand. In some embodiments, analog circuitry 620 may communicate with circuitry external to IC 550 to form more complex systems, sub-systems, control blocks, and information processing blocks, as desired.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560. In some embodiments, control circuitry 570 may initiate or respond to a reset operation. The reset operation may cause a reset of one or more blocks coupled to link 560, of IC 550, etc., as persons of ordinary skill in the art will understand. For example, control circuitry 570 may cause PMU 580, and signal generator(s), such as frequency synthesizers or LO 25 (as used in an RF receiver 10/75 and/or RF transmitter 88), and/or other circuitry in IC 550 to reset to an initial state. In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include USB, Ethernet, and the like. In exemplary embodiments, other communication protocols may be used, depending on factors such as specifications for a given application, as persons of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, and the like, as desired. In some embodiments, the memory read and/or write operations involve the use of one or more blocks in IC 550, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown). NV memory 635 may be used for storing information related to performance or configuration of one or more blocks in IC 550. For example, NV memory 635 may store configuration information related to signal generator(s), such as frequency synthesizers or LO 25 (as used in an RF receiver 10/75 and/or RF transmitter 88), for example, frequency plans for reception and/or transmission of RF signals.

Various circuits and blocks described above and used in exemplary embodiments may be implemented in a variety of ways and using a variety of circuit elements or blocks. For example, LNA 20, LO 25, mixer 30, ADC 35, signal processing circuitry 40, data processing circuitry 55, filter 80, PGA 85, baseband up-converter circuit 90, offset PLL circuit 92, TX VCO circuit 94, power amplifier 96, signal source 133, PFD 136, charge pump (CP) 139, loop filter (LF) 142, VCO 145, divider 148, quadrature signal generator 151, multi-modulus divider 154, crystal oscillator 170, switches 176 and 179, current sources 173 and 182, loop filter 142, inverters 189, 192, and 209, TIA 194, logic circuit 206, transistor stacks (generally labeled as 212), buffers 303 and 309, counter 330, divide by ⅔ circuits 333, and the circuitry in IC 550, may generally be implemented using digital, analog, or mixed-signal circuitry. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. In addition, analog circuitry or mixed-signal circuitry or both may be included, for instance, power converters, discrete devices (transistors, capacitors, resistors, inductors, diodes, etc.), and the like, as desired.

The analog circuitry may include bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand.

The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

As persons of ordinary skill in the art will understand, one may apply the disclosed concepts effectively to various apparatus. Examples described in this document, such as MCUs or the depicted RF receivers, transmitters, and transceivers, constitute merely illustrative applications, and are not intended to limit the application of the disclosed concepts to other apparatus by making appropriate modifications, as persons of ordinary skill in the art will understand.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus comprising:
 a signal generator comprising:
  a voltage controlled oscillator (VCO) coupled to provide an output signal having a frequency; and
  an asymmetric divider coupled to receive the output signal of the VCO and to provide an output signal having a frequency lower than the frequency of the output signal of the VCO,
  wherein the asymmetric divider presents a balanced load to the VCO.

2. The apparatus according to claim 1, wherein the asymmetric divider comprises a plurality of flip flops coupled in a cascade configuration.

3. The apparatus according to claim 2, wherein the plurality of flip flops in the asymmetric divider comprise a first set of transistors having a first size, and a second set of transistors having a second size, wherein the first size is different than the second size.

4. The apparatus according to claim 2, wherein the asymmetric divider comprises a logic circuit coupled to the plurality of flip flops, wherein the logic circuit changes a duty cycle of the output signal of the asymmetric divider in response to a control signal.

5. The apparatus according to claim 1, further comprising a quadrature signal generator coupled to receive the output signal of the asymmetric divider and to provide in-phase and quadrature signals as output signals.

6. The apparatus according to claim 5, wherein the output signals of the quadrature signal generator are balanced.

7. The apparatus according to claim 5, wherein the quadrature signal generator further comprises a shift register coupled to receive the output signal of the asymmetric divider and to provide as output signals shifted versions of the output signal of the asymmetric divider, wherein the output signals of the shift register are balanced.

8. The apparatus according to claim 7, wherein the shift register comprises a plurality of flip flops coupled in a cascade configuration.

9. The apparatus according to claim 8, wherein the plurality of flip flops in the shift register comprise a first set of transistors having a first size, and a second set of transistors having a second size, wherein the first size is different than the second size.

10. An integrated circuit (IC) comprising:
a frequency synthesizer comprising:
    a voltage controlled oscillator (VCO) coupled to provide an output signal having a frequency that is a function of a control signal;
    a first divider coupled to receive the output signal of the VCO, and to divide the frequency of the output signal of the VCO to generate an output signal with a lower frequency than the frequency of the output signal of the VCO; and
    a shift register coupled to receive and shift the output signal of the first divider to generate balanced quadrature output signals comprising at least one in-phase signal and at least one quadrature signal.

11. The IC according to claim 10, wherein the first divider in the frequency synthesizer has an asymmetric topology, and wherein the first divider presents a balanced load to the VCO.

12. The IC according to claim 10, further comprising a radio frequency (RF) circuit to use the at least one in-phase signal and the at least one quadrature signal and to mix a pair of signals.

13. The IC according to claim 10, wherein the RF circuit comprises an RF receiver and an RF transmitter, and wherein the frequency synthesizer further comprises a logic circuit to change a duty cycle of the output signal of the first divider depending on whether the at least one in-phase signal and the at least one quadrature signal are provided to the RF receiver or to the RF transmitter.

14. The IC according to claim 10, wherein the frequency synthesizer further comprises:
    a second divider to divide the frequency of the output signal of the first divider to generate an output signal; and
    a phase locked loop coupled to receive an oscillator output signal and the output signal of the second divider to generate the control signal.

15. A method of generating a signal, the method comprising:
    generating a signal, using a voltage controlled oscillator (VCO), having a frequency;
    receiving the signal from the VCO in an asymmetric divider; and providing an output signal of the asymmetric divider, the output signal having a frequency lower than the frequency of the signal generated by the VCO,
    wherein the asymmetric divider presents a balanced load to the VCO.

16. The method according to claim 15, further comprising changing a duty cycle of the output signal of the asymmetric divider in response to a control signal.

17. The method according to claim 15, further comprising using a quadrature signal generator coupled to receive the output signal of the asymmetric divider and to provide in-phase and quadrature signals as output signals.

18. The method according to claim 17, wherein the output signals of the quadrature signal generator are balanced.

19. The method according to claim 17, wherein using a quadrature signal generator coupled to receive the output signal of the asymmetric divider and to provide in-phase and quadrature signals as output signals further comprises shifting the output signal of the asymmetric divider and to shifted versions of the output signal of the asymmetric divider as output signals, wherein the output signals are balanced.

20. The method according to claim 17, further comprising using the in-phase and quadrature signals as local oscillator (LO) signals to mix signals in a radio frequency (RF) circuit.

* * * * *